United States Patent [19]
Kim

[11] Patent Number: 5,877,512
[45] Date of Patent: Mar. 2, 1999

[54] LIQUID CRYSTAL DISPLAY DEVICE HAVING UNIFORM PARASITIC CAPACITANCE BETWEEN PIXELS

[75] Inventor: Dong-Gyu Kim, Suwon-si, Rep. of Korea

[73] Assignee: Samsung Electronics Co., Ltd., Kyungki-Do, Rep. of Korea

[21] Appl. No.: 686,952

[22] Filed: Jul. 26, 1996

[30] Foreign Application Priority Data

Jul. 28, 1995 [KR] Rep. of Korea .................. 1995 22855

[51] Int. Cl.$^6$ .......................... H01L 29/04; H01L 31/036
[52] U.S. Cl. ............................................... 257/57; 257/59
[58] Field of Search ................................ 257/57, 59, 66, 257/72

[56] References Cited

U.S. PATENT DOCUMENTS 5,049,952  9/1991  Choi ........................................... 257/57

FOREIGN PATENT DOCUMENTS 94-6989  4/1991  Rep. of Korea .......................... 257/59

OTHER PUBLICATIONS

English translation of claim 1 of Korean document No. 94-6989 cited above.

*Primary Examiner*—Steven H. Loke
*Attorney, Agent, or Firm*—Pillsbury Madison & Sutro LLP

[57] ABSTRACT

A liquid crystal display device according to the present invention includes pixels having uniform parasitic capacitance values. Each pixel comprises at least one thin film transistor. The gate electrode of the thin film transistor is formed from part of a gate line, so as to reduce the overall area occupied by the transistor. A drain electrode is formed over and within the width of the gate line and parallel to the source electrode, and having a surface area less than the underlying portion of the gate line. In addition, the source electrode and the drain electrode are isolated, but electrically connected to a semiconductor layer, from the gate electrode. A drain electrode extension is connected with the drain electrode and a pixel electrode, and projects outward over both width edges of the gate line. The drain electrode and drain electrode extension are dimensioned with sufficient margins with respect to the gate line to account for misalignments between the drain electrode and the gate line. In this way, the difference in pixel brightness due to differences in parasitic capacitance is removed by eliminating the possibility of alignment errors from varying the parasitic capacitance between pixels. Moreover, the area which the thin film transistor occupies is respectively widened compared with the prior art and the number of corrections to be made on each wiring layer is decreased because the cross steps of the gate electrode and the source electrode that occur on the underlying layer are reduced.

5 Claims, 3 Drawing Sheets

LIQUID CRYSTAL DISPLAY DEVICE HAVING UNIFORM PARASITIC CAPACITANCE BETWEEN PIXELS

BACKGROUND OF THE INVENTION

1. Field of the Invention

The present invention relates to a liquid crystal display device, and more particularly, to a liquid crystal display in which each of the pixels comprising the liquid crystal display has the same parasitic capacitance.

2. Description of Related Art

A TFT-LCD (thin film transistor liquid crystal display) is a display in which thin film transistors serve as switching elements for a plurality of pixels so as to control an electro-optic effect of liquid crystal material. The display includes a multiplicity of pixels, each having a thin film transistor, a pixel electrode and a storage capacitor; a color filter device wherein the common electrode and the color filter are formed; and liquid crystal material sealed in the color filter device. In this type of LCD, each pixel generally contains a number of capacitors, such as, for example, a liquid crystal capacitor formed by a TFT matrix circuit glass plate and a color filter glass plate with the liquid crystal layer in between; a maintenance capacitor formed by the pixel electrode and a maintenance electrode; and a parasitic capacitor formed by a gate electrode, a source electrode and a drain electrode.

The parasitic capacitance will be described in detail with reference to FIG. 1, which is a cross-sectional view of a conventional TFT.

As illustrated in FIG. 1, the thin film transistor comprises a gate electrode 2, a source electrode 6 and a drain electrode 7 formed on transparent glass substrate 1. A gate isolation layer 3 covers gate electrode 2, and, on gate isolation layer 3, a channel layer 4 is formed with amorphous silicon such that it is situated above the upper part of gate electrode 2.

Channel layer 4, being connected with source electrode 6 and drain electrode 7 through contact layer 5, is composed of $n^+$-amorphous silicon. Drain electrode 7 is further connected with a pixel electrode 8.

As shown in FIG. 1, which is a cross sectional view of a TFT in FIG. 2, a portion "b" of drain electrode 7 overlaps gate electrode 2 to form a capacitor. This is what is commonly called a parasitic capacitor, the capacitance of which is called parasitic capacitance.

This parasitic capacitance has the following effect. When voltage is applied to the gate electrode of the TFT, an alternating current signal, shifted between source electrode 6 and drain electrode 7, is transitionally transmitted to the liquid crystal capacitor, the parasitic capacitor, and to the storage capacitor. The parasitic capacitance of a TFT is normally greater than that of a MOSFET, such that the wave pattern of this alternating current signal becomes anti-symmetrical. Resulting from this anti-symmetrical signal phenomenon is an offset voltage problem and undesired flickering.

To attempt to overcome these problems, a compensating voltage is applied to an electrode situated at the opposite end of the liquid crystal layer. However, by undertaking this countermeasure, other problems arise. For example, when a plurality of pixels are formed on a TFT substrate, parasitic capacitors are formed in each of the pixels as a result of overlapping portions of drain electrode 7 with gate electrode 2, as shown in FIG. 1. Further, when the drain electrode and the gate electrode are misaligned, due to slight alignment errors during processing, such as misalignment during patterning layers using a photolithographic process, the parasitic capacitance values can be vary from pixel to pixel. This problem is exacerbated when the voltage applied to the opposite electrode is unable to compensate for the offset voltages caused by all of the different parasitic capacitance values and is only able to compensate for some of the different parasitic capacitance values.

Therefore, in addition to compensating for the offset voltages arising from the parasitic capacitance, it is necessary to form pixels having equal parasitic capacitance in order to solve the above-mentioned problem. The method as described in FIG. 2 is suggested in Korean Patent Public Information and Public Announcement Number 94-6989.

In the conventional method shown in FIG. 2, each pixel comprises, at least, one pair of TFTs. The two transistors are formed symmetrically with respect to middle line (A—A) which is parallel to data line 14. Gate electrode 12 for both TFTs is formed such that it perpendicularly extends from two different parts of a single gate line 11 and is symmetrical with respect to middle line (A—A). Drain electrode 13, connected with the pixel electrode (not drawn), is symmetrical with respect to, and formed along, middle line (A—A), parallel to data line 14. So, the left part of drain electrode section 13, with respect to the middle line (A—A), acts as a drain electrode for the left TFT, and the right part of drain electrode section 13 acts as a drain electrode for the right TFT.

Finally, as shown in FIG. 2, the conventional structure includes source electrodes 16 and 15 of the left and right TFTs, respectively. Source electrode 15 of the right TFT is formed perpendicularly to data line 14 and parallel with drain electrode 13, and source electrode 16 of the left TFT is formed perpendicularly to data line 14. The line connecting source electrode 15 of the right TFT with data line 14 crosses portions of gate electrode 12, then is angled toward the upper side and formed in parallel with drain electrode 13. Reference numeral 17, not described, indicates a channel layer formed by a semiconductor material.

A drawback of this conventional structure is that the area occupied by the TFTs increases. Further, when arranging pixels in a vertical stripe pattern, aperture efficiency decreases. Moreover, because the line connecting source electrode of the left transistor with the data line is formed to cross the two gate electrodes, the area of the gate electrode which is superposed by the source electrode increases, and as a result, a time constant of each wiring layer increases.

SUMMARY OF THE INVENTION

The present invention aims at solving the above problems, and in particular, at eliminating the difference between parasitic capacitances of each pixel while increasing aperture efficiency and decreasing time constants for each wiring layer.

To achieve these and other objects, a liquid crystal display device according to the present invention includes pixels having uniform parasitic capacitance values. Each pixel comprises at least one thin film transistor. The gate electrode of the thin film transistor is formed from part of a gate line, so as to reduce the overall area occupied by the transistor. A drain electrode is formed over and within the width of the gate line and parallel to the source electrode, and having a surface area less than the underlying portion of the gate line. In addition, the source electrode and the drain are isolated, but electrically connected to a semiconductor layer, from the gate electrode. A drain electrode extension is connected with the drain electrode and a pixel electrode, and projects outward over both width edges of the gate line. The drain electrode and drain electrode extension are dimensioned with sufficient margins with respect to the gate line to account for misalignments between the drain electrode and the gate line. In this way, the difference in pixel brightness due to differences in parasitic capacitance is removed by eliminating the possibility of alignment errors from varying the parasitic capacitance between pixels. Moreover, the area which the thin film transistor occupies is respectively widened compared with the prior art and the number of corrections of each wiring layer is decreased because the cross steps of the gate electrode and the source electrode that occur on the underlying layer are reduced.

BRIEF DESCRIPTION OF THE DRAWINGS

The accompanying drawings illustrate the preferred embodiments of the invention and, together with the following detailed description, serve to explain the principles of the invention. In the drawings.

DETAILED DESCRIPTION OF THE PREFERRED EMBODIMENTS

Description will now be made in detail of the preferred embodiments of the present invention, examples of which are illustrated in the accompanying drawings, wherein like reference numbers are used throughout to refer to like elements.

Figure 3:
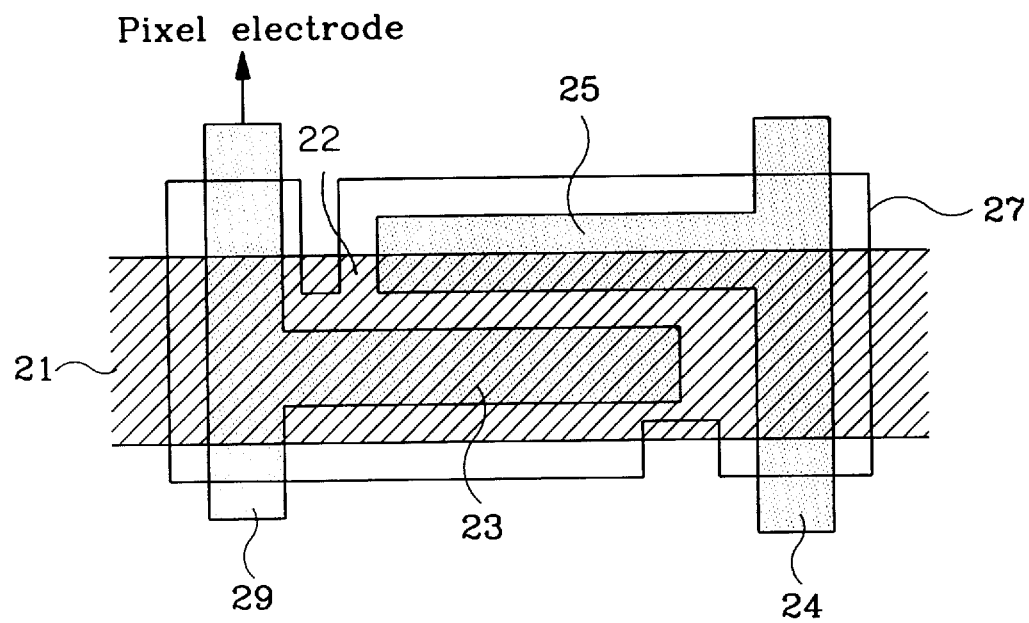
FIGS. 3 and 4 are plan views showing the layout of a TFT-LCD according to two preferred embodiments of the present invention.

FIG. 3 is a plan view which illustrates the layout of a LCD device according to a first preferred embodiment of the present invention. As shown in this figure, gate line 21 and data line 24 are formed perpendicularly with respect to each other and overlap. A transistor is formed in the area where gate line 21 and data line 24 overlap. The transistor uses part of gate line 21 as a gate electrode 22.

The part of data line 24 that protrudes perpendicularly outward so as to be superposed by gate line 21 becomes a source electrode 25 of the transistor. A drain electrode 23 of the transistor is not as wide as gate line 21 and is formed inside of the width of gate line 21. It is separated from and parallel with source electrode 25. The drain electrode 23 shown in FIG. 3 is rectangular in shape and has a width less than that of gate line 21. However, it should be noted that other shapes and orientations of drain electrode 23 are possible, as long as it is completely formed over gate line 21. Further, just as the width of drain electrode 23 is preferably less than the width of gate line 21, preferably the overall surface area of the drain electrode is less than the underlying gate line so as to provide a margin against possible misalignment errors between the drain electrode and the gate line, as will be more fully discussed below.

A channel layer 27 where a channel of the transistor is formed is isolated from gate line 21 but is connected electrically with source electrode 25 and drain electrode 23. Drain electrode 23 is connected with a drain electrode extension 29 for connection with a pixel electrode (not illustrated).

Drain electrode extension 29 is formed perpendicularly with respect to gate line 21 and has a certain width. In addition, drain electrode extension 29 extends outward in both directions from the sides of gate line 21. In the present embodiment, although drain electrode extension 29 is formed perpendicularly with respect to gate line 21, it does not necessarily have to be so, as long it is at a fixed angle with respect to gate line 21. The length of drain electrode extension 29 is greater than the width of gate line 21, and preferably is at least twice that of the width of gate line 21, which is found to be sufficient to provide an adequate margin for typical misalignment errors. Also, the total distance from where drain electrode extension 29 and drain electrode 23 are connected with each other to the ends of drain electrode extension 29 is at least equal to the width of gate line 21.

Figure 4:
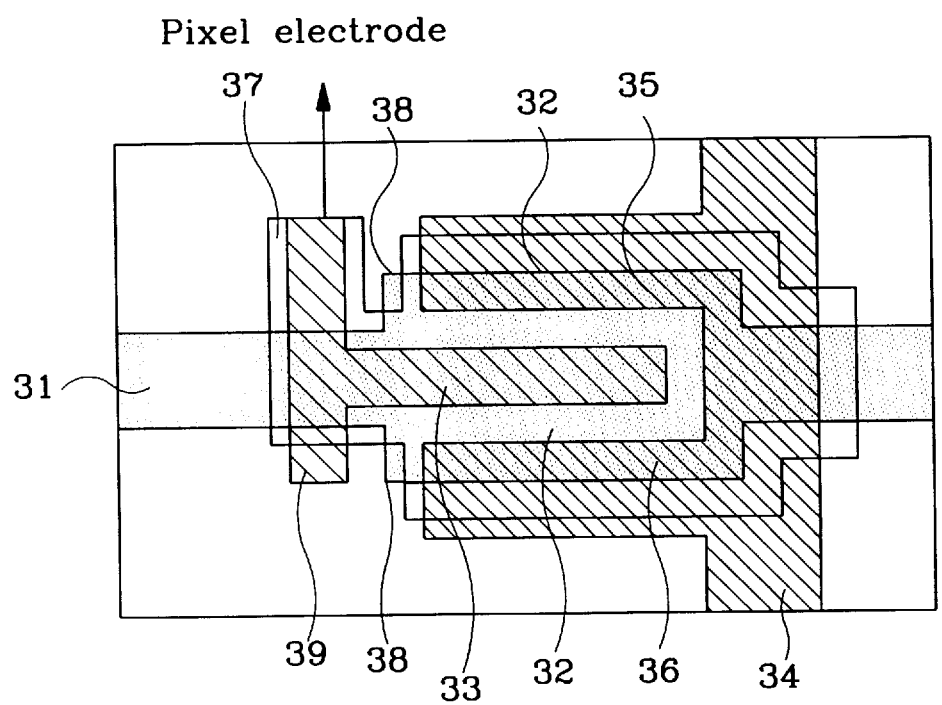

FIG. 4 is a plan view which illustrates the layout of a LCD-TFT device according to another preferred embodiment of the present invention, wherein gate line 31 and data line 34 are formed perpendicularly with respect to each other. In this embodiment, two transistors, which both utilize part of gate line 31 as their gate electrode, are formed symmetrically with respect to gate line 31 and adjacent to the intersection of gate line 31 and data line 34. Because the gate electrodes of the two transistors must be formed from the same gate line 31, as illustrated in FIG. 4, in the area where gate line 31 and data line overlap, protruding portions of gate line 31 become gate electrode 32 which serves as the gate electrode of the two transistors. Source electrodes 35,36 of the two transistors are formed symmetrically with respect to gate line 31. The source electrodes protrude perpendicularly from respective portions of data line 34 at the upper and lower side of the crossing part of the two wirings 31,34 and are spread parallel to each other. Portions of both source electrodes 35,36 overlap gate electrode 32.

Drain electrode 33, which serves as the drain electrode for both of the two transistors, is formed in parallel with and separated by an identical space interval from the two source electrodes 35. It is smaller in width than gate line 31 and gate electrode 32, and is formed within the width of gate line 31 and gate electrode 32.

Drain electrode 33 is connected with drain electrode extension 39 so as to be connected with the pixel electrode (not illustrated). Drain electrode extension 39 is formed perpendicularly with respect to gate line 31 and has a fixed width. In addition, drain electrode extension 39 projects outwardly in both directions form the sides of gate line 31. However, as in the embodiment of FIG. 3, in the present embodiment, although drain electrode extension 39 is shown to be formed perpendicularly with respect to gate line 31, it does not necessarily have to be formed at a 90° angle as long as it is formed at a fixed angle.

The length of drain electrode extension 39 is at least twice that of the width of gate line 31 to provide a margin against misalignment. Also, the total distance from where drain electrode extension 39 and drain electrode 33 are connected with each other and the ends of drain electrode extension 39 is at least that equal to the width of gate line 21.

The channel layer 37, wherein channels of both transistors are formed, is isolated from gate line 31, but it is connected electrically with source electrode 35 and drain electrode 33. Its width is larger than gate electrode 32 where the transistors are formed.

In order to prevent the occurrence of gate step at the channel of source electrodes 35,36, gate electrode 32 is projected so as to be longer than the protrusions from data line 34 that form source electrodes 35,36. Also, the wider part of the channel layer 37 begins in the space between the projection corners of gate electrode 32 and the end of source electrodes 35,36 (as indicated by reference numeral 38 in FIG. 4).

Identical parasitic capacitance between pixels is maintained in these two embodiments, as will be described in more detail with reference to FIGS. 5 and 6.

Figure 5:
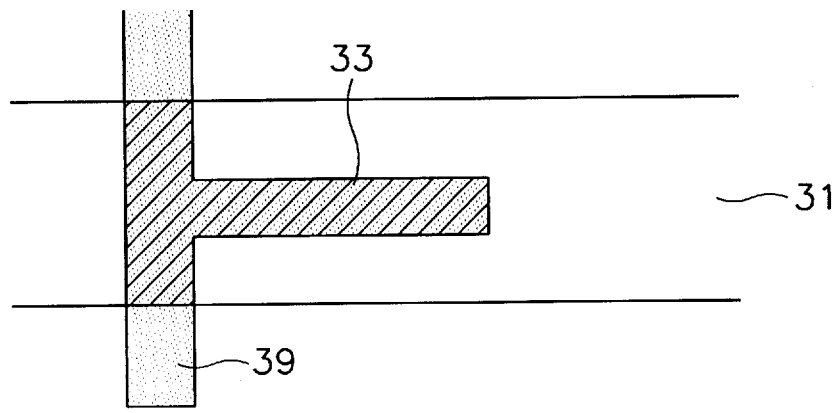
FIGS. 5 and 6 illustrate different alignments of the drain electrode of FIGS. 3 and 4 with the gate line.
Figure 6:
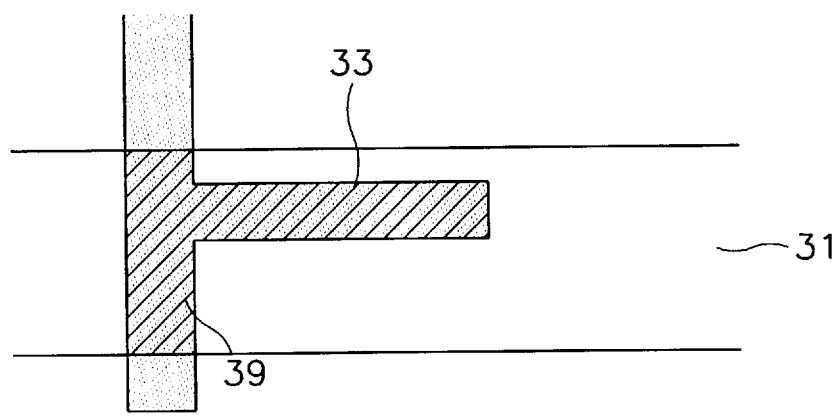

FIGS. 5 and 6, for illustration purposes, show only the drain electrode of FIG. 4 (or the drain electrode of FIG. 3), the drain electrode extension, and the gate line. FIG. 5 shows the correct arrangement of the drain electrode, the drain electrode extension and the gate line. In this exemplary embodiment, drain electrode 33 is connected to drain electrode extension 39 at its midpoint. FIG. 6 shows a case where the drain electrode and the drain electrode extension are misaligned with respect to gate line 31 due to errors in patterning and positioning the drain electrode and gate line during processing, such as misalignment during a photolithographic process.

In FIG. 6, suppose that drain electrode 33 and drain electrode extension 39 are misaligned towards the lower or upper width edge of gate line 31 but that drain electrode 33 is still formed such that it is completely inside the width of gate line 31. Although the alignment of the layers in FIG. 6 is different from the proper alignment of layers 33 and 39 over line 31 shown in FIG. 5, because line 33 is formed inside the width of the line 31, the area of layer 33 within line 31 is the same in both FIGS. 5 and 6.

Compare the total surface area of gate line layer 31, drain electrode layer 33 and drain electrode extension layer 39 in both figures. As shown in FIG. 5, drain electrode layer 33 and drain electrode extension layer 39 are deposited over gate line layer 31. Because drain electrode layer 33 is formed having a size less than the underlying portion of gate line 31 and fully inside the width of gate line layer 31 in FIG. 6, the total surface area overlapping gate line 31, of the layers forming drain electrode 33, and drain electrode extension 39 in FIG. 5, is equal to the total surface area overlapping gate line 31, of the layers forming drain electrode 33, and drain electrode extension 39 in FIG. 6.

Also, because drain electrode extension 39 is formed of sufficient length as described above, neither end of it is within the width of the gate line. Moreover, as the drain electrode extension is formed perpendicularly with respect to the gate line having a fixed width, it has the same area whether or not it is properly aligned with respect to the width edges of the gate line. Since the parasitic capacitance is proportional to the overlapping area of the two electrodes, in the end, even when the layers are aligned incorrectly, the overlapping area is the same, and therefore, no difference occurs in the parasitic capacitance between pixels. The preferred lengths and orientation of the drain electrode extension are provided to ensure that the typical range offset errors due to misalignment do not affect the overlapping area of the drain electrode and drain electrode extension, thus preserving the uniform parasitic capacitance among the pixels.

The method by which a LCD device according to the present invention is fabricated will now be described in detail with reference to FIGS. 3 and 4.

First, Ta, Cr, Al or other conductive material is formed to a thickness in the range of 200–400 nm on a substrate such as an insulating glass substrate. It is then patterned to form gate lines 21,31, gate electrodes 22,32 and the storage electrode (not illustrated) which forms the lower electrode of a charge accumulation device. Further, when manufacturing a LCD device such as that illustrated in FIG. 4, in the area where gate line 31 and the later formed data line 34 intersect, gate electrode 32 is formed so that it protrudes outwardly from both width edges of gate line 31. Moreover, when using Al or Ta, a subsequent process step of forming a positive pole oxidation film can also be added.

Next, an insulation layer of, for example, $SiN_x$ (silicon nitride) is deposited to a thickness in the range of 300–400 nm over the entire surface to form a gate isolation layer. In succession, a semiconductor layer of, for example, a-Si (amorphous silicon) is formed on the gate isolation layer to a thickness of about 200 nm and a semiconductor contact layer of $n^+$-a-Si ($n^+$-amorphous silicon), which connects the semiconductor layer with the source and drain electrodes, is formed on the semiconductor layer to a thickness of about 50 nm.

Through photolithography, the $n^+$-a-Si semiconductor contact layer and the a-Si semiconductor layer are patterned to have the shape of the channel layers 27,37 pattern as illustrated in FIGS. 3 and 4, respectively. Further, when forming a structure as in FIG. 4, in a portion of the channel layer 37 overlapping with gate electrode 32, the channel layer is made wider than gate electrode 32, and the pattern is formed such that two corners 38 of gate electrode 32 are exposed.

Thereafter, a transparent conductive material, indium-tin-oxide (ITO) for example, is deposited to a thickness of about 50 μnm. The layer is then patterned by photolithography to form the pixel electrodes (not illustrated). Then, a metal layer using metals such as Cr, Ta, Ti is deposited to a thickness in the range of 150–300 nm. It is then patterned by photolithography to form data lines 24,34, source electrodes 25,35, drain electrodes 23,33, and drain electrode extensions 29,39.

When forming a source electrode transistor structure as in FIG. 3, the end part of drain electrode 23 is formed to partially extend over the gate line 21 and perpendicularly from data line 24. And although drain electrode 23 is formed to be separated by a regular interval from and parallel to source electrode 25, it is smaller in width than the width of gate line 21 and completely within the width edges of gate line 21. One end of drain electrode 23 is connected to drain electrode extension 29 which is formed perpendicularly (or at another fixed angle) with respect to gate line 21 and having a fixed width. It is also formed to extend outwardly from both width edges of gate line 21. The length of drain electrode extension 29 is preferably at least twice that of the width of gate line 21 to provide a margin to guard against misalignment. Also, the distance from where drain electrode extension 29 is connected to drain electrode 23 to each end of drain electrode extension 29 is preferably equal to or more than the width of gate line 21. One end of drain electrode extension 29 is made so as to connect with the pixel electrode (not shown).

When forming the structure shown in FIG. 4, source electrodes 35,36 are formed to perpendicularly extend from data line 34 such that they are symmetrical with respect to gate line 31. The source electrodes are formed parallel to each other and portions of each source electrode respectively overlap gate electrode 32 from the point where they perpendicularly extend from data line 34 at the upper and lower part of the intersection between gate line 31 and data line 34. The portion of data line 34 composing source electrodes 35,36 must not overlap the end of the wider part of the channel layer 37, so that gate step does not occur due to the relationship between the channel, source electrodes 35,36 and gate electrode 32.

Drain electrode 33 is formed to become the drain electrode for both of the two transistors, and is formed within the width of gate line 31 and gate electrode 32. It is parallel with and evenly spaced between the two source electrodes 35,36, and the width thereof is less than the width of gate line 31 and gate electrode 32. One end of drain electrode 33 connects with drain electrode extension 39 which is formed perpendicularly (or other fixed angle) with respect to gate line 31 and of fixed constant width, and which extends outwardly from both sides of gate line 31. Preferably, the length of drain electrode extension 39 is at least twice the width of gate line 31. Also, the total distance from where drain electrode extension 39 and drain electrode 33 are connected to the ends of drain electrode extension 39 is preferably greater than or equal to the width of gate line 31. One end of drain electrode extension 39 must be connected with the pixel electrode (not illustrated).

After dry-etching the n$^+$-amorphous silicon which remains exposed, a protection film of SiN$_x$ (silicon nitride), for example, is formed over the entire structure with a thickness in the range of 200–400 μm.

In the drawings of FIG. 3 and FIG. 4, the a-Si semiconductor layer and the semiconductor contact layer composed of n$^+$-amorphous silicon, in which the channel layer 27,37, data lines 24,34, source electrodes 25,35,36, drain electrodes 23,33, and drain electrode extensions 29,39 are patterned, are deposited on the gate isolation layer which is not patterned.

In this way, TFTs which are symmetrical with respect to gate line 21,31 are formed, and a TFT-LCD device according to the preferred embodiments of the present invention is completed. Therefore, by connecting drain electrode extension with drain electrode, and perpendicularly forming the drain electrode with respect to the gate line, a uniform parasitic capacitance between each pixel is maintained, as discussed with reference to FIGS. 5 and 6. In addition, unlike the conventional LCD illustrated in FIG. 2, in the embodiment of the present invention illustrated in FIG. 4, although the gate electrode extends in two directions from the gate line, because only part of the gate line is extended and composes the gate electrode of the two transistors, the area of the whole TFT decreases.

Figure 1:
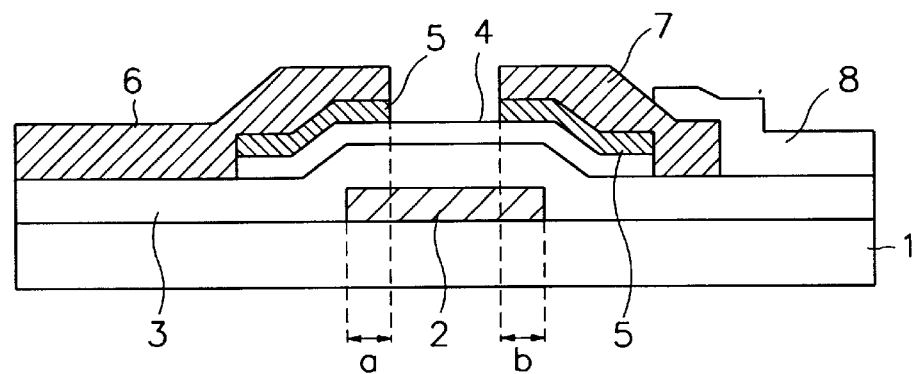
FIG. 1 is a cross-sectional view illustrating the structure of a conventional TFT.
Figure 2:
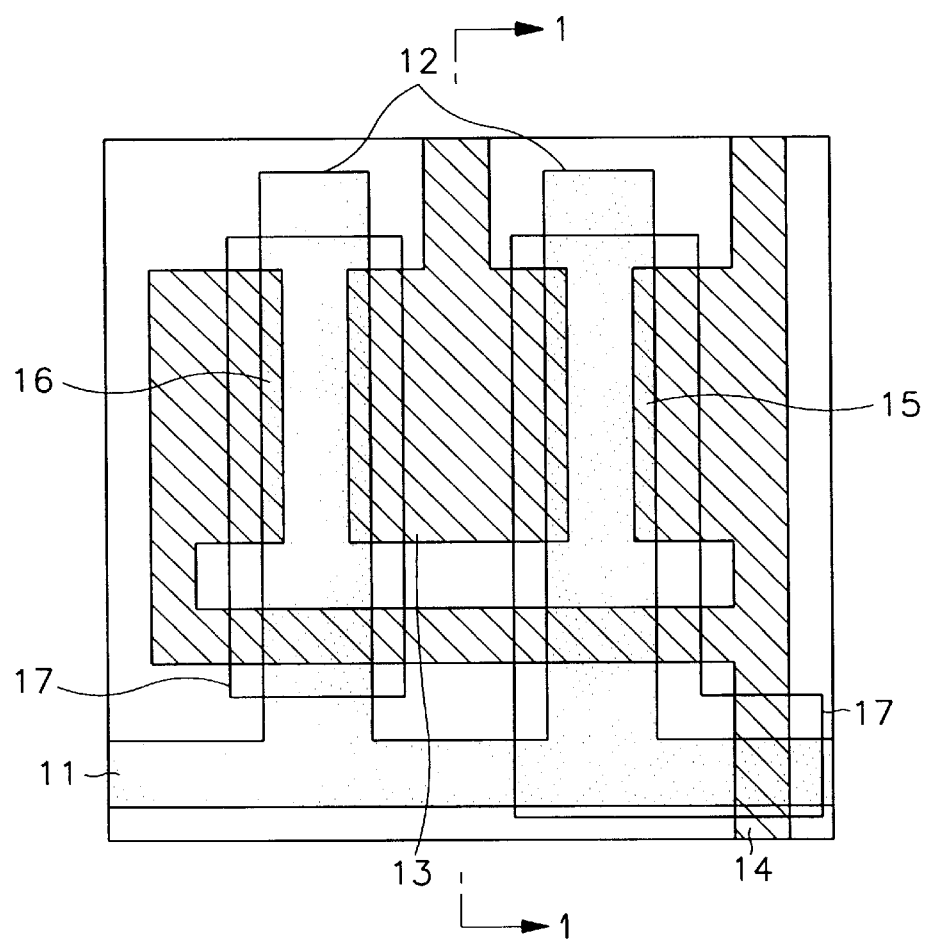
FIG. 2 is a plan view showing the layout of a conventional LCD pixel using a pair of TFTs.

Moreover, in the source electrode of the conventional structure illustrated in FIG. 2, the source electrode of one TFT extends perpendicularly from the data line, and the source electrode of the other TFT not only also extends perpendicularly from the data line and again, but further extends vertically toward the upper side, causing the overall area to increase, and causing the additional gate and source electrode to increase the thickness of the TFT pair. However, in the present invention, the source electrode of each transistor extends perpendicularly only once from the data line. This decreases the area required, and further results in eliminating unnecessary layers overlapping each other, which in turn increases the thickness of the TFT.

In addition, as illustrated by reference number 38 of FIG. 4, the source and drain electrodes have the same height since they were both deposited in the same process on the projected gate electrode. This uniform height enables the n$^+$-amorphous silicon to be dry etched to a uniform thickness.

Accordingly, in the present invention, differences in light intensity originating from each pixel due to differences in parasitic capacitances are eliminated, while the area which each TFT occupies is expanded as compared to the prior art. Moreover, the rate of aperture increases by the degree of about 5% when arranging pixels according to the perpendicular stripe method. Furthermore, the number of corrections required for each wiring layer decreases because the number of overlaps between the gate electrode and the source electrode is reduced to a minimum.

Although the present invention has been described with reference to the preferred embodiments thereof, those skilled in the art will readily appreciate that various substitutions and modifications can be made thereto without departing from the spirit and scope of the invention as set forth in the appended claims.

What is claimed is:
1. A liquid crystal display panel, comprising:
   a plurality of gate lines parallel to one another;
   a plurality of data lines crossing the gate lines, the data lines being insulated from the gate lines;
   a plurality of thin film transistors, each thin film transistor being formed near a crossing point of the gate line and the data line and having a source electrode and a drain electrode, wherein the source electrode extends from the data line and is partially overlapped with the gate line, and the drain electrode is fully overlapped with the gate line and formed opposite the source electrode with respect to the gate line;
   a plurality of drain electrode extensions, each drain electrode extension extending from the drain electrode such that both ends of the drain electrode extension are located outside the gate electrode; and
   a plurality of pixel electrodes connected to the drain electrodes.
2. A liquid crystal display panel, comprising
   a plurality of gate lines parallel to one another;
   a plurality of data lines crossing the gate lines, the data lines being insulated from the gate lines;
   a plurality of thin film transistors, each thin film transistor being formed near a crossing point of the gate line and the data line and having a source electrode and a drain electrode, wherein the source electrode extends from the data line and has two branches substantially parallel to each other, the branches are located opposite to each other with respect to the gate line and partially overlapped with the gate line, and the drain electrode is fully overlapped with the gate line and formed between the branches;
   a plurality of drain electrode extensions, each drain electrode extension extending from the drain electrode such that both ends of the drain electrode extension are located outside the gate electrode; and
   a plurality of pixel electrodes connected to the drain electrode extensions.
3. A liquid crystal display, comprising:
   a plurality of gate lines being formed parallel to one another;
   a plurality of data lines being formed parallel to one another and perpendicular to said gate lines, said data lines overlapping respective gate lines at a multiplicity of intersection points;
   a multiplicity of pixels being formed adjacent to respective ones of said intersection points, each of said pixels being coupled to a respective gate line and a respective data line, each of said gate lines having first and second side edges in the vicinity of each of said pixels, each of said pixels including:
       a thin transistor having:
           a gate electrode being formed by a portion of said respective gate line;

a source electrode being formed at least partially over said gate electrode and connected to said respective data line; and a drain electrode separated from said source electrode and being completely formed over said gate electrode;

a semiconductor layer which is insulated from and formed over said gate line and which is electrically connected with said source electrode and said drain electrode;

a pixel electrode; and a drain electrode extension having a predetermined width and a predetermined length, said drain electrode extension having a first end connected to said pixel electrode and a second end opposite said first end, said drain electrode extension being oriented at a predetermined angle with respect to the length of said respective gate line, said first and second ends extending beyond the respective first and second edges of said respective gate line.

4. A liquid crystal display as defined in claim 3, wherein said predetermined angle is 90°.

5. A liquid crystal display as defined in claim 4, wherein said predetermined length of said drain electrode extension is at least twice the distance between the side edges of said respective gate line.

* * * * *

UNITED STATES PATENT AND TRADEMARK OFFICE
CERTIFICATE OF CORRECTION

PATENT NO.      : 5,877,512

DATED           : March 2, 1999

INVENTOR(S)     : KIM

It is certified that error appears in the above-identified patent and that said Letters Patent is hereby corrected as shown below:

Column 2, lines 17, 21, 23 and 25, Change "(A-A)" to --(1-1)--.

Signed and Sealed this

Eighth Day of February, 2000

Attest:

Q. TODD DICKINSON

*Attesting Officer*   *Commissioner of Patents and Trademarks*